(12) United States Patent
Nguyen et al.

(10) Patent No.: US 11,430,526 B2
(45) Date of Patent: Aug. 30, 2022

(54) INTERLEAVED TWO-PASS DATA PROGRAMMING TECHNIQUES WITH REDUCED WRITE AMPLIFICATION

(71) Applicant: Micron Technology, Inc., Boise, ID (US)

(72) Inventors: Phong Sy Nguyen, Livermore, CA (US); James Fitzpatrick, Laguna Niguel, CA (US); Kishore Kumar Muchherla, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/127,413

(22) Filed: Dec. 18, 2020

(65) Prior Publication Data

US 2022/0199172 A1   Jun. 23, 2022

(51) Int. Cl.
*G11C 16/34* (2006.01)
*G11C 16/10* (2006.01)
*G11C 16/30* (2006.01)
*G11C 16/26* (2006.01)

(52) U.S. Cl.
CPC .......... *G11C 16/3404* (2013.01); *G11C 16/10* (2013.01); *G11C 16/26* (2013.01); *G11C 16/30* (2013.01); *G11C 2211/561* (2013.01)

(58) Field of Classification Search
CPC ................................................ G11C 16/3404
See application file for complete search history.

(56) References Cited

U.S. PATENT DOCUMENTS

| | | | |
|---|---|---|---|
| 10,109,361 B1* | 10/2018 | Khakifirooz | G11C 11/5628 |
| 2005/0162923 A1* | 7/2005 | Guterman | G11C 11/5628 365/185.28 |
| 2009/0225596 A1 | 9/2009 | Shin et al. | |
| 2010/0058145 A1 | 3/2010 | Yoshida | |
| 2010/0061151 A1* | 3/2010 | Miwa | G11C 11/5628 365/185.17 |
| 2010/0182830 A1 | 7/2010 | Ryu et al. | |
| 2013/0088928 A1* | 4/2013 | Kwak | G11C 16/34 365/189.05 |
| 2016/0062907 A1* | 3/2016 | Mouler | G11C 11/5628 711/202 |
| 2016/0163382 A1 | 6/2016 | Conley et al. | |
| 2017/0097869 A1 | 4/2017 | Sharon et al. | |

* cited by examiner

*Primary Examiner* — Douglas King
(74) *Attorney, Agent, or Firm* — Greenberg Traurig (57) ABSTRACT

In a coarse programming, the threshold voltage of the memory cell is programmed to a first level representative of N−1 bit values data according to a first mapping between combinations of values of N−1 possible bits and threshold levels. A group identification is representative of whether the first level is an odd or even numbered level in the first mapping. For a fine programming, the memory cell is read, based on the group identification, to obtain the N−1 bit values; and at least one additional bit is received to join the N−1 bit values to form at least N bit values. The threshold voltage of the memory cell is then finely programmed to a second level representative of the at least N bit values according to a second mapping between combinations of values of the at least N possible bits and threshold levels.

14 Claims, 8 Drawing Sheets

| | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| QLC Level | 0 | 1 | 2 | 3 | 4 | 5 | 6 | 7 | 8 | 9 | 10 | 11 | 12 | 13 | 14 | 15 |
| Top Page (TP) Bit | 1 | 0 | 0 | 1 | 1 | 0 | 0 | 1 | 1 | 0 | 0 | 1 | 1 | 0 | 0 | 1 |
| Extra Page (XP) Bit | 1 | 1 | 1 | 1 | 1 | 1 | 0 | 0 | 0 | 0 | 0 | 0 | 0 | 0 | 1 | 1 |
| Upper Page (UP) Bit | 1 | 1 | 1 | 0 | 0 | 0 | 0 | 0 | 0 | 1 | 1 | 1 | 0 | 0 | 0 | 0 |
| Lower Page (LP) Bit | 1 | 1 | 0 | 0 | 0 | 0 | 0 | 0 | 1 | 0 | 1 | 1 | 1 | 1 | 1 | 1 |
| TLC Level | 0 | | 1 | | 2 | | 3 | | 4 | | 5 | | 6 | | 7 | |
| Group ID | 1 | | 0 | | 1 | | 0 | | 1 | | 0 | | 1 | | 0 | |
| Even MLC Level | 0 | | | | 1 | | | | 2 | | | | 3 | | | |
| Old MLC Level | | | 0 | | | | 1 | | | | 2 | | | | 3 | |

INTERLEAVED TWO-PASS DATA PROGRAMMING TECHNIQUES WITH REDUCED WRITE AMPLIFICATION

TECHNICAL FIELD

At least some embodiments disclosed herein relate to memory systems in general, and more particularly, but not limited to techniques to program voltage thresholds of memory cells in memory systems to store multiple bits of data per memory cell.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The embodiments are illustrated by way of example and not limitation in the figures of the accompanying drawings in which like references indicate similar elements.

DETAILED DESCRIPTION

At least some aspects of the present disclosure are directed to techniques to improve storing multiple bits per memory cell in a memory sub-system. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

An integrated circuit memory cell (e.g., a flash memory cell) can be programmed to store data by the way of its state at a predefined voltage. For example, if the memory cell is configured/programmed in a state that allows a substantial current to pass the memory cell at the predefined voltage, the memory cell is storing a bit of one; and otherwise, the memory cell is storing a bit of zero. Further, a memory cell can store multiple bits of data by being configured/programmed differently at multiple predefined voltages. For example, the memory cell can store multiple bits of data by having a combination of states at the multiple predefined voltages; and different combinations of the states of the memory cell at the predefined voltages can be interpreted to represent different states of bits of data that is stored in the memory cell.

Although the threshold voltage of a memory cell can be adjusted/programmed via applying voltage pulses to the memory cell, it is generally difficult to adjust/program the threshold voltage of a memory cell precisely to a predetermined voltage. A typical programming operation can move the threshold voltage of a memory cell to a voltage region, with varying probability levels of the threshold voltage actually being at different voltages within the region of threshold distribution.

Thus, a programming operation can move the threshold voltage of the memory cell into a region of threshold distribution, where the probability density level of the threshold voltage of the memory cell being at any voltage in the region is above a predetermined threshold density. A programming operation that results in a wide region of threshold distribution is coarse and thus less accurate than a programming operation that results in a narrow region of threshold distribution. A coarse programming operation is typically faster than a fine, accurate programming operation.

To store multiple bits per memory cell, the threshold voltage of the memory cell can be programmed into different regions so that each of the regions represents a different combination of bit values.

To reduce the probability of error in reading the memory cell, it is desirable to reduce, minimize, and/or eliminate overlaps in the regions of threshold voltage resulting from the programming operations. Increasing the number of bits stored per memory cell leads to the requirement to reduce the width of regions of threshold distribution and thus the requirement to increase the precision/accuracy of the programming operations.

Increasing the precision/accuracy of a programming operation generally leads to a longer time period for the data programming operation. When the time used for programming the threshold voltage of the memory cell increases, the speed of storing data in the memory cell decreases.

Multi-pass programming can be used to speed up the storing data in a memory cell by programming the threshold voltage of the memory cell to a narrow region of threshold distribution. An initial pass of coarse programming can be used to rapidly move the threshold voltage of the memory cell with less precision. As a result, the threshold voltage of the memory cell is moved to a relatively wide region of threshold distribution. A subsequent pass of fine programming can be used to fine tune and move the threshold voltage of the memory cell to a relatively narrow region of threshold voltage distribution to reduce the probability of read error. The combination of coarse programming and fine programming can be faster than directly programming the memory cell to a narrow region of threshold distribution.

Multi-pass programming can lead to increased complexity in the circuitry used to apply the multiple passes of programming. For example, buffers may be used in some implementations to store the input data for the subsequent pass of programming. Optionally, some memory cells in a memory device may be used in a single level cell (SLC) mode to store/buffer the input data temporarily, one bit per memory cell, for subsequent use in the next pass. Such an arrangement can eliminate the need for a separate type of memory cells for buffering data but increase write amplification for the memory device and/or reduced usable memory/storage capacity from the point of view of the user.

At least some aspects of the present disclosure address the above and other deficiencies by coarsely programming a reduced number of bits per memory cell (e.g., 3 bits per cell) in a way that allows the coarsely programmed memory cells to be used reliably as a buffer. To improve the speed and/or accuracy of retrieving the data back from the coarsely programmed memory cell, an indicator is stored to identify the possible threshold levels for the memory cell. The indicator can be stored in available memory in a single level cell (SLC) mode (e.g., 1 bit per cell).

Since the indicator eliminates some threshold levels from possibility for the reading of the memory cell, the coarsely programmed memory cell can be read accurately (e.g., in a multi-level cell (MLC) mode (e.g., 2 bits per cell)), even when the region of threshold distribution resulting from the coarse programming is very wide for the reduced number of bits per cell (e.g., 3 bits per cell) in a normal operation. In some implementations, the indicator can be calculated from an XOR or XNOR operation to eliminate the possibility of alternating threshold levels being programmed for storing the reduced number of bit per memory cell.

After the data of the reduced number of bits per memory cell is retrieved, with the help of the indicator, from the coarsely programmed memory cell, additional data can be received to form a dataset of a predetermined number of bits per memory cell (e.g., 4 bits per cell); and a fine programming operation can then be applied to store the entire dataset at the predetermined number of bits per memory cell (e.g., 4 bits per cell).

Such programming techniques can reduce the requirements in using separate memory cells to buffer data for the fine pass programming, reduce write amplification, and/or increase the memory/storage capacity available to users.

Figure 1:
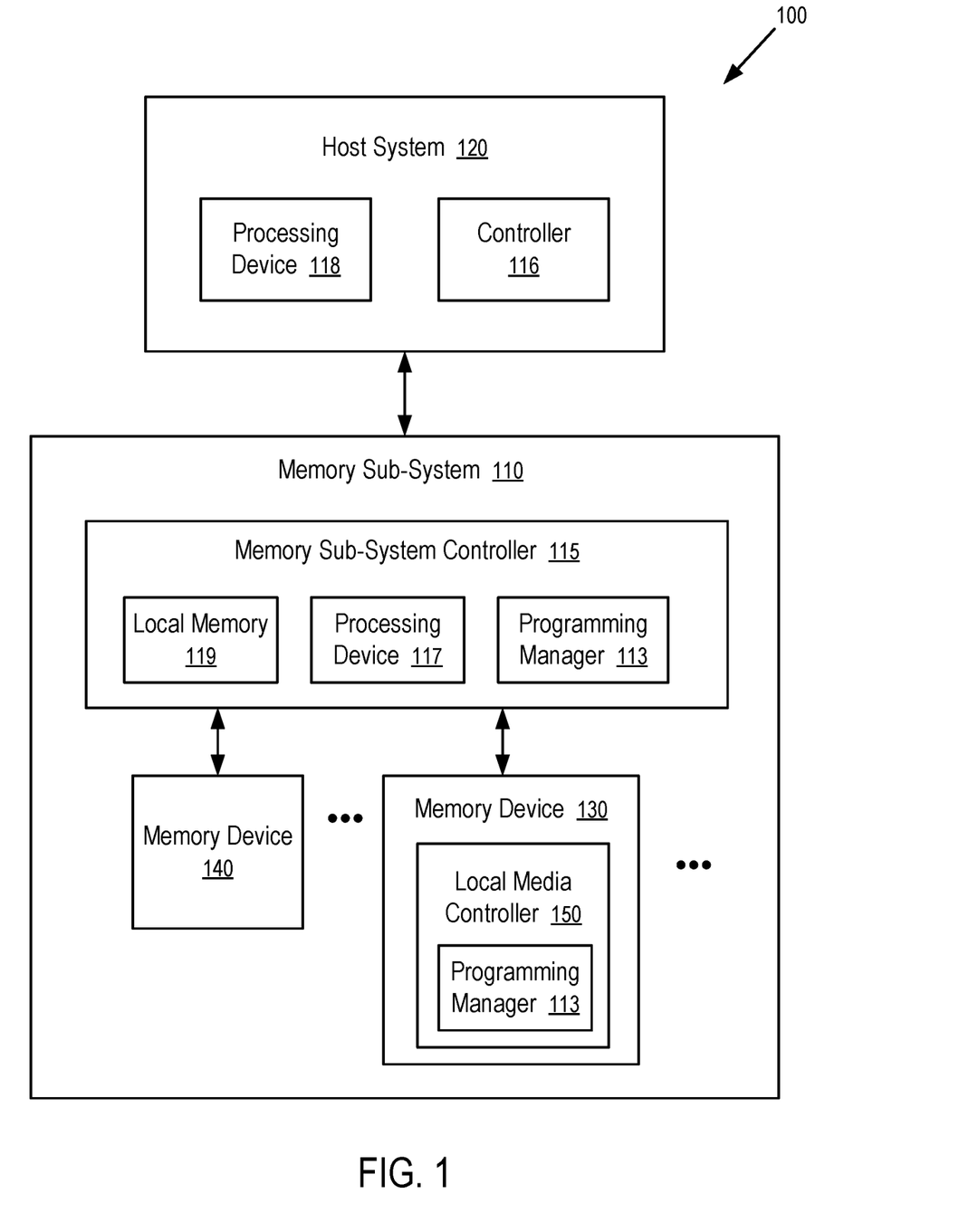
FIG. 1 illustrates an example computing system having a memory sub-system in accordance with some embodiments of the present disclosure.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or such a computing device that includes memory and a processing device.

The computing system 100 can include a host system 120 that is coupled to one or more memory sub-systems 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset (e.g., processing device 118) and a software stack executed by the processor chipset. The processor chipset can include one or more cores, one or more caches, a memory controller (e.g., controller 116) (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, a universal serial bus (USB) interface, a Fibre Channel, a Serial Attached SCSI (SAS) interface, a double data rate (DDR) memory bus interface, a Small Computer System Interface (SCSI), a dual in-line memory module (DIMM) interface (e.g., DIMM socket interface that supports Double Data Rate (DDR)), an Open NAND Flash Interface (ONFI), a Double Data Rate (DDR) interface, a Low Power Double Data Rate (LPDDR) interface, or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The processing device 118 of the host system 120 can be, for example, a microprocessor, a central processing unit (CPU), a processing core of a processor, an execution unit, etc. In some instances, the controller 116 can be referred to as a memory controller, a memory management unit, and/or an initiator. In one example, the controller 116 controls the communications over a bus coupled between the host system 120 and the memory sub-system 110. In general, the controller 116 can send commands or requests to the memory sub-system 110 for desired access to memory devices 130, 140. The controller 116 can further include interface circuitry to communicate with the memory sub-system 110. The interface circuitry can convert responses received from memory sub-system 110 into information for the host system 120.

The controller 116 of the host system 120 can communicate with controller 115 of the memory sub-system 110 to perform operations such as reading data, writing data, or erasing data at the memory devices 130, 140 and other such operations. In some instances, the controller 116 is integrated within the same package of the processing device 118. In other instances, the controller 116 is separate from the package of the processing device 118. The controller 116 and/or the processing device 118 can include hardware such as one or more integrated circuits (ICs) and/or discrete components, a buffer memory, a cache memory, or a combination thereof. The controller 116 and/or the processing device 118 can be a microcontroller, special purpose logic circuitry (e.g., a field programmable gate array (FPGA), an application specific integrated circuit (ASIC), etc.), or another suitable processor.

The memory devices 130, 140 can include any combination of the different types of non-volatile memory components and/or volatile memory components. The volatile memory devices (e.g., memory device 140) can be, but are not limited to, random access memory (RAM), such as dynamic random access memory (DRAM) and synchronous dynamic random access memory (SDRAM).

Some examples of non-volatile memory components include a negative- and (or, NOT AND) (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs, or any combination of such. In some embodiments, a particular memory device can include an SLC portion, an MLC portion, a TLC portion, a QLC portion, and/or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as 3D cross-point type and NAND type memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations (e.g., in response to commands scheduled on a command bus by controller 116). The controller 115 can include hardware such as one or more integrated circuits (ICs) and/or discrete components, a buffer memory, or a combination thereof. The hardware can include digital circuitry with dedicated (e.g., hard-coded) logic to perform the operations described herein. The controller 115 can be a microcontroller, special purpose logic circuitry (e.g., a field programmable gate array (FPGA), an application specific integrated circuit (ASIC), etc.), or another suitable processor.

The controller 115 can include a processing device 117 (e.g., processor) configured to execute instructions stored in a local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 does not include a controller 115, and can instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory devices 130. The controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory devices 130.

In some embodiments, the memory devices 130 include local media controllers 150 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local media controller 150) for media management within the same memory device package. An example of a managed memory device is a managed NAND (MNAND) device.

The controller 115 and/or a memory device 130 can include a programming manager 113 configured to perform interleaved two-pass data programming with reduced write amplification. In some embodiments, the controller 115 in the memory sub-system 110 and/or the controller 150 in the memory device 130 can include at least a portion of the programming manager 113. In other embodiments, or in combination, the controller 116 and/or the processing device 118 in the host system 120 includes at least a portion of the programming manager 113. For example, the controller 115, the controller 116, and/or the processing device 118 can include logic circuitry implementing the programming manager 113. For example, the controller 115, or the processing device 118 (e.g., processor) of the host system 120, can be configured to execute instructions stored in memory for performing the operations of the programming manager 113 described herein. In some embodiments, the programming manager 113 is implemented in an integrated circuit chip disposed in the memory sub-system 110. In other embodiments, the programming manager 113 can be part of firmware of the memory sub-system 110, an operating system of the host system 120, a device driver, or an application, or any combination therein.

For example, the programming manager 113 implemented in the controller 115 and/or the controller 150 can initially receive a reduced number (e.g., N−1) of data groups (e.g., pages) for programming into a memory cell group in the memory device 130 that will be subsequent programmed to store a predetermined number (e.g., N) of bits per memory cells. The programming manager 113 generates a group (e.g., page) of indicators by applying an XOR (or XNOR) operation on the reduced number of data groups. The programming manager 113 initiates a coarse programming to store the reduced number (e.g., N−1) of data groups (e.g., pages) into the memory cell group, where each memory cell in the memory cell group stores one bit from each of the reduced number (e.g., N−1) of data groups. Each memory cell in the memory cell group has a corresponding indicator bit (e.g., generated from an XOR or XNOR operation on its bits stored via the coarse programming). The indicator identifies a set of possible threshold levels of the memory cell. When the indicator bit has one value, the set of possible threshold levels of the memory cell corresponds to the even numbered threshold levels of storing the reduced number (e.g., N−1) of bits per memory cell; and when the indicator bit has the other value, the set of possible threshold levels of the memory cell corresponds to the odd numbered threshold levels of storing the reduced number (e.g., N−1) of bits per memory cell. The memory cells having the indicator bit equal to one can be considered to be in a first group programmed in an N−2 bit per memory cell; and the memory cells having the indicator bit equal to zero can be considered to be in a second group programmed in an N−2 bit per memory cell; and the regions of threshold distributions of the first group and the second group are configured to be interleaved and correspond to the threshold levels of storing N−1 bits per memory cell. Thus, the possible threshold levels of different indicator bits are interleaved. The indicator bit allows the memory device 130 to read the coarsely programmed memory cell to retrieve the reduced number (e.g., N−1) bits by reading in an N−2 bit per memory cell mode based on the value of the indicator. After receiving a further data group, a fine programming operation can be performed to store the predetermined number (e.g., N) of data groups into the memory cell group that has been coarsely programmed.

Figure 2:
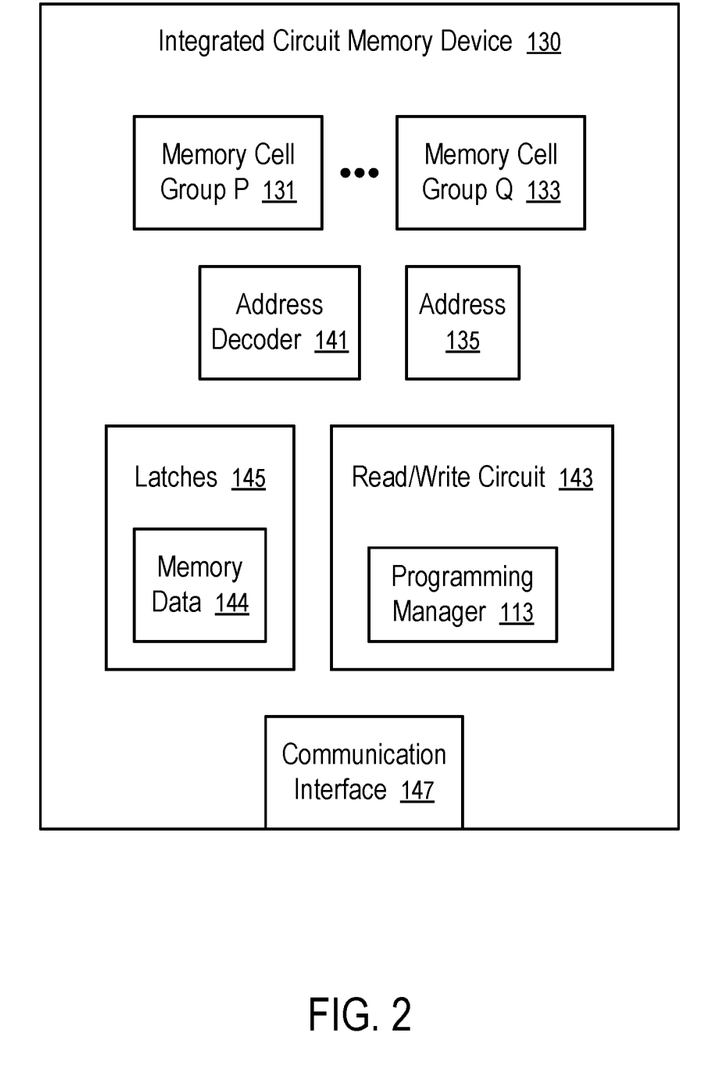
FIG. 2 illustrates an integrated circuit memory device having a programming manager configured to program threshold voltages of memory cells to store data according to one embodiment.

FIG. 2 illustrates an integrated circuit memory device having a programming manager configured to program threshold voltages of memory cells to store data according to one embodiment. For example, the memory devices 130 in the memory sub-system 110 of FIG. 1 can be implemented using the integrated circuit memory device 130 of FIG. 2.

The integrated circuit memory device 130 can be enclosed in a single integrated circuit package. The integrated circuit memory device 130 includes multiple groups 131, . . . , 133 of memory cells that can be formed in one or more integrated circuit dies. A typical memory cell in a group 131 (or group 133) can be programmed to store one or more bits of data.

Some of the memory cells in the integrated circuit memory device 130 can be configured to be operated together for a particular type of operations. For example, memory cells on an integrated circuit die can be organized in planes, blocks, and pages. A plane contains multiple blocks; a block contains multiple pages; and a page can have multiple strings of memory cells. For example, an integrated circuit die can be the smallest unit that can independently execute commands or report status; identical, concurrent operations can be executed in parallel on multiple planes in an integrated circuit die; a block can be the smallest unit to perform an erase operation; and a page can be the smallest unit to perform a data program operation (to write data into memory cells). Each string has its memory cells connected to a common bitline; and the control gates of the memory cells at the same positions in the strings in a block or page are connected to a common wordline. Control signals can be applied to wordlines and bitlines to address the individual memory cells.

The integrated circuit memory device 130 has a communication interface 147 to receive a command having an address 135 from the controller 115 of a memory sub-system 110, retrieve memory data 144 from memory cells identified by the memory address 135, and provide at least the memory data 144 as part of a response to the command. Optionally, the memory device 130 may decode the memory data 144 (e.g., using an error-correcting code (ECC) technique) and provide the decoded data as part of a response to the command. An address decoder 141 of the integrated circuit memory device 130 converts the address 135 into control signals to select a group of memory cells in the integrated circuit memory device 130; and a read/write circuit 143 of the integrated circuit memory device 130 performs operations to determine the memory data 144 stored in the memory cells at the address 135.

The integrated circuit memory device 130 has a set of latches 145 to hold memory data 144 temporarily while the read/write circuit 143 is programming the threshold voltages of a memory cell group (e.g., 131 or 133). For example, the read/write circuit 143 can program the threshold voltages of memory cells in a memory cell group 131 to store N bits per memory cell. The memory cell group (e.g., 131 or 133) has M memory cells. The latches 145 are configured to store N×M bits of data in the form of N data groups. Each of the data group has M bits of data to be stored respectively into M memory cells in the memory cell group (e.g., 131 or 133).

When the latches 145 have N data groups to be stored into a memory cell group (e.g., 131), the programming manager 113 is configured to determine and program threshold voltage levels of memory cells in the memory cell group (e.g., 131). The threshold voltage levels can be determined according to the values of bits in the memory data 144 and a Gray code that maps bit value combinations to threshold levels, such that any two combinations of bit values represented by two successive threshold levels differ by and only by one bit.

In one embodiment, the memory device 130 initially receives N−1 data groups for coarse programming of the threshold voltages of memory cells in a memory cell group (e.g., 131). The operating of coarse programming moves the threshold voltages of the memory cells to voltage regions that are close to the threshold levels for storing N data groups. The coarse programming is configured to store the N−1 data groups to the memory cell group, where each memory cell stores one bit from each of the N−1 data groups. The coarse programming maps the N−1 bit values to be stored in each memory cell to its coarsely programmed threshold level. The coarse threshold level is one of the $2^{N-1}$ possible combinations of N−1 bit values. An indicator is generated to identify whether the coarse threshold level of each memory cell is an odd numbered level or an even numbered level. Thus, the value of the indicator reduces the possible voltage levels of each memory cell to $2^{N-2}$, allowing the read/write circuit 143 to read N−1 bit values of data stored in each memory cells by differentiating $2^{N-2}$ threshold levels. Such an arrangement can reduce the precision requirement for the coarse programming and the time to perform the coarse programming and/or improve the accuracy of reading the N−1 bit values from each coarsely programmed memory cell. The group indicators can be stored in another memory cell group (e.g., 133) that is used as a buffer to eliminate the need to manufacture a different types of memory cells as the buffer. For example, the indicators can be stored in the buffer memory cell group (e.g., 133) in a SLC mode for improved speed and increased program/erase budget, relative to other modes that store more than one bit per memory cells. After the coarse programming, the memory device 130 receives the additional data group (e.g., from the controller 115 of the memory sub-system 110) and read the N−1 data groups from the coarsely programmed memory cell group (e.g., 131) to form N data groups. An operation of fine programming is performed to store the N data groups in the previously coarsely programmed memory cell group (e.g., 131). The fine programming moves threshold voltages of memory cells in the group (e.g., 131) to 2N threshold levels with fine regions of threshold distribution that allow the N data groups to be read from the memory cell group (e.g., 131). The indicator group can be discarded after reading the N−1 data groups from the coarsely programmed memory cell group (e.g., 131).

Figure 6:
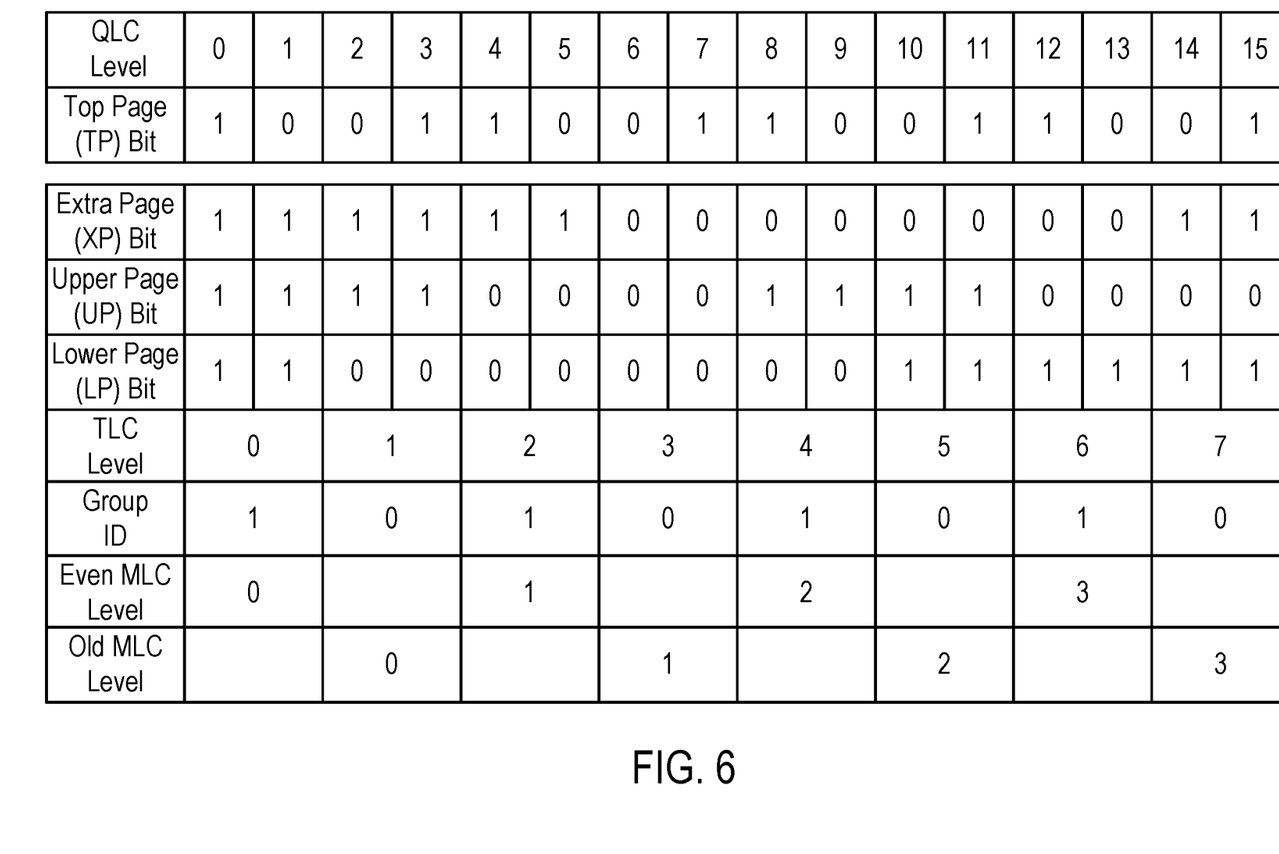
FIG. 6 shows mapping to threshold levels and group identifications in two-pass programming of memory cells to store data according to one embodiment.

In some implementations, the threshold levels of the coarse and fine programming are determined using a Gray code, as illustrated in FIG. 6. A Gray code can map a combination of bit values to a threshold level such that one bit and only one bit is changed in the bit values when the threshold level represented by the bit value combination changes to the next larger or smaller threshold level. In some implementations, the indicator group can be computed by applying XOR (or XNOR) to the N−1 data groups.

Figure 3:
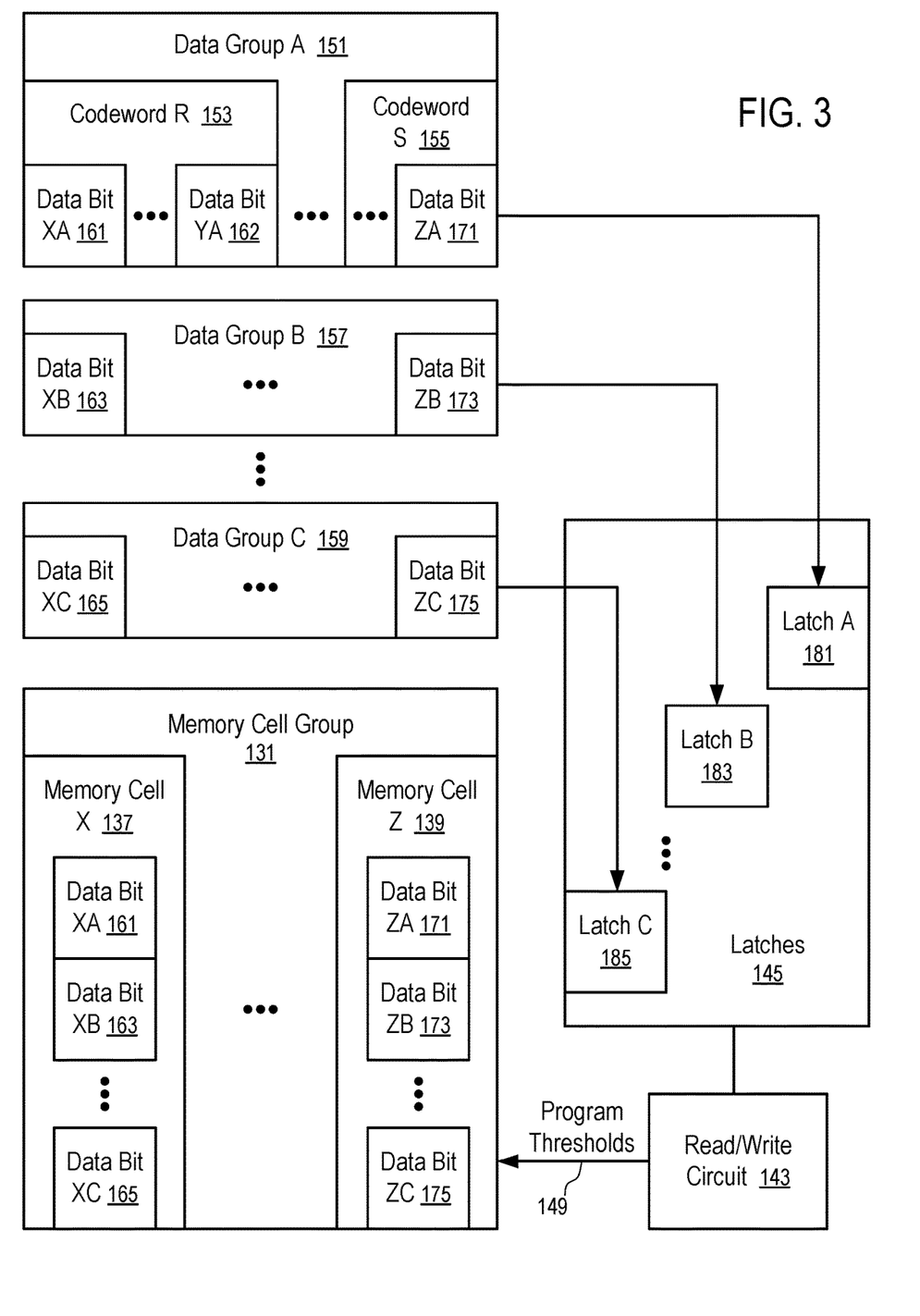
FIG. 3 shows an example of programming memory cells to store multiple bits per memory cell according to one embodiment.

FIG. 3 shows an example of programming memory cells to store multiple bits per memory cell according to one embodiment. For example, the example of FIG. 3 can be implemented in the memory device 130 of FIG. 1 and/or FIG. 2.

In FIG. 3, a memory cell group 131 has memory cells 137, . . . , 139. A number of data groups 151, 157, . . . , 159 provide data bits to be stored into the memory cells 137, . . . , 139. The number of bits provided in each data group (e.g., 157, 159, or 151) equals to the number of memory cells 137 to 139 in the memory cell group 131. Each memory cell (e.g., 139 or 137) stores a set of bits, one from each of the data groups 151, 157, . . . , and 159.

For example, the data bits 161, 163, . . . , 165 from the data groups 151, 157 . . . , 159 are stored into one memory cell 137; and the voltage threshold of the memory cell 137 is programmed by the read/write circuit 143 at a level that represents the values of the data bits 161, 163, . . . , 165. Similarly, the data bits 171, 173, . . . , 175 from the data groups 151, 157 . . . , 159 are stored into another memory cell 139 and represented by the level of the voltage threshold of the memory cell 139.

Optionally, the data bits in a data group can be organized in codeword 153, codeword 155 according to an error detection and data recovery technique, such as Error Correction Code (ECC) (e.g., Low-Density Parity-Check (LDPC) code).

For example, a codeword 153 in the data group 151 can include data bit 161 to data bit 162. When one of data bit in the codeword 153 is in error, the error can be detected and corrected (e.g., using a technique of Low-Density Parity-Check (LDPC)).

When the data groups 151, 157, . . . , 159 are stored in the latches 181, 183, . . . , 185, the read/write circuit 143 can program 149 thresholds of the memory cells 137, . . . , 139 such that the voltage thresholds of the memory cells 137, . . . , 139 represent the values of the respective data bits from the data groups 151, 157, . . . , 159.

A combination of the values of the data bits (e.g., 161, 163, . . . , 165) to be stored in a memory cell (e.g., 137) is mapped to the level of a voltage threshold of the memory cell (e.g., 137) based on a Gray code. For example, a read/write circuit 143 can include a table of a Gray code (e.g., as illustrated by the table of FIG. 6) to map between the values of a set of data bits (e.g., 161, 163, . . . , 165) of a memory cell (e.g., 137) and a threshold level of the memory cell (e.g., 137) that represents the values of the set of data bits (e.g., 161, 163, . . . , 165).

To accelerate the operation to program 149 threshold voltages of the memory cells 137, . . . , 139 to store the data groups 151, 157, . . . , 159, the read/write circuit 143 can be configured to use two-pass programming operation. In a first coarse programming, the threshold voltages of the memory cell group 131 are moved to relatively wide regions of threshold distribution near the fine regions of threshold distributions. The coarsely programmed threshold voltages are determined based on threshold levels representative of the data groups 157, . . . , 159. A group of threshold level indicators is computed and stored/buffered temporarily to assist the accurate reading of the data groups 157 to 159 from the coarsely programmed memory cell group 131. After reading the data groups 157 to 159 back into the latches 183, . . . , 185 and further receiving the data group 151 into the latches 181, the read/write circuit 143 can perform the fine programming to move the threshold voltages of the memory cells 137, . . . , 139 into fine regions of threshold distributions representative of the data bits in the data groups 151, . . . , 157, 159, as discussed in further details below in connection with FIGS. 4, 5 and/or 6.

Figure 4:
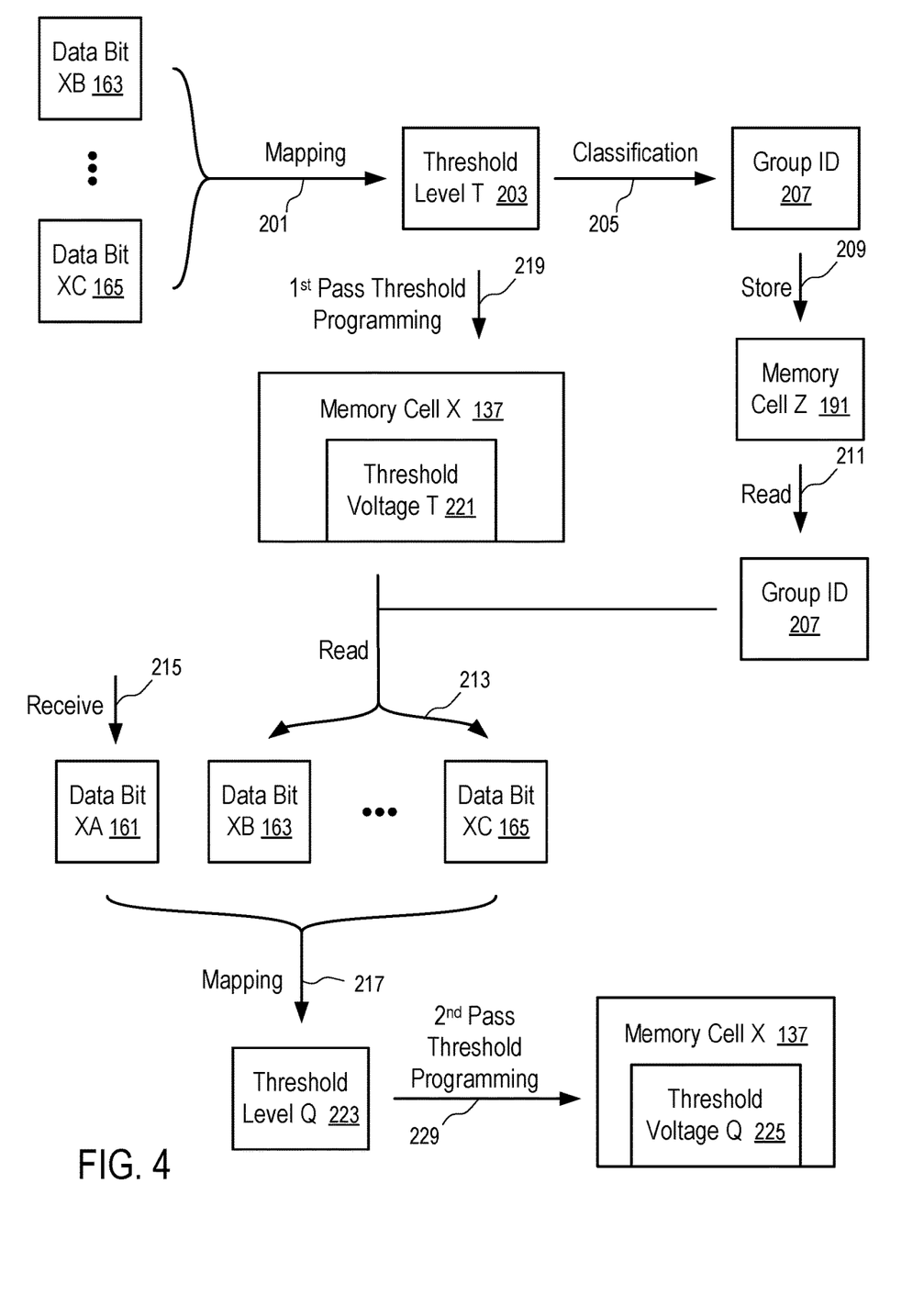
FIG. 4 shows a two-pass programming technique to store multiple bits per memory cell according to one embodiment.

FIG. 4 shows a two-pass programming technique to store multiple bits per memory cell according to one embodiment. For example, the technique of FIG. 4 can be implemented in the memory device 130 of FIG. 2 in a memory sub-system 110 of FIG. 1.

In FIG. 4, a reduced number (N−1) of data bits 163 to 165 are used to determine coarse programming threshold level T 203 through a mapping 201 between bit value combinations and coarse programming threshold levels.

All possible coarse programming threshold levels are classified into two groups. For example, the coarse programming threshold levels are numbered in an increasing order. The classification 205 is configured to place the even numbered levels in an even group and the odd numbered levels into an odd group. The group identification 207 indicates whether the threshold level 203 of a memory cell 137 is in the even group or in the odd group. The even and odd groups can be programmed to interleave regions of threshold distribution that are close to the final regions of threshold regions.

A first pass operation of threshold programming 219 is performed to move the threshold voltage 221 of the memory cell 137 of a memory cell group 131 to a relatively wide region of threshold distribution. The read/write circuit 143 can store 209 the group identification 207 of the memory cell 137 in another memory cell 191 (e.g., in a different memory cell group 133 in a SLC mode).

Figure 5:
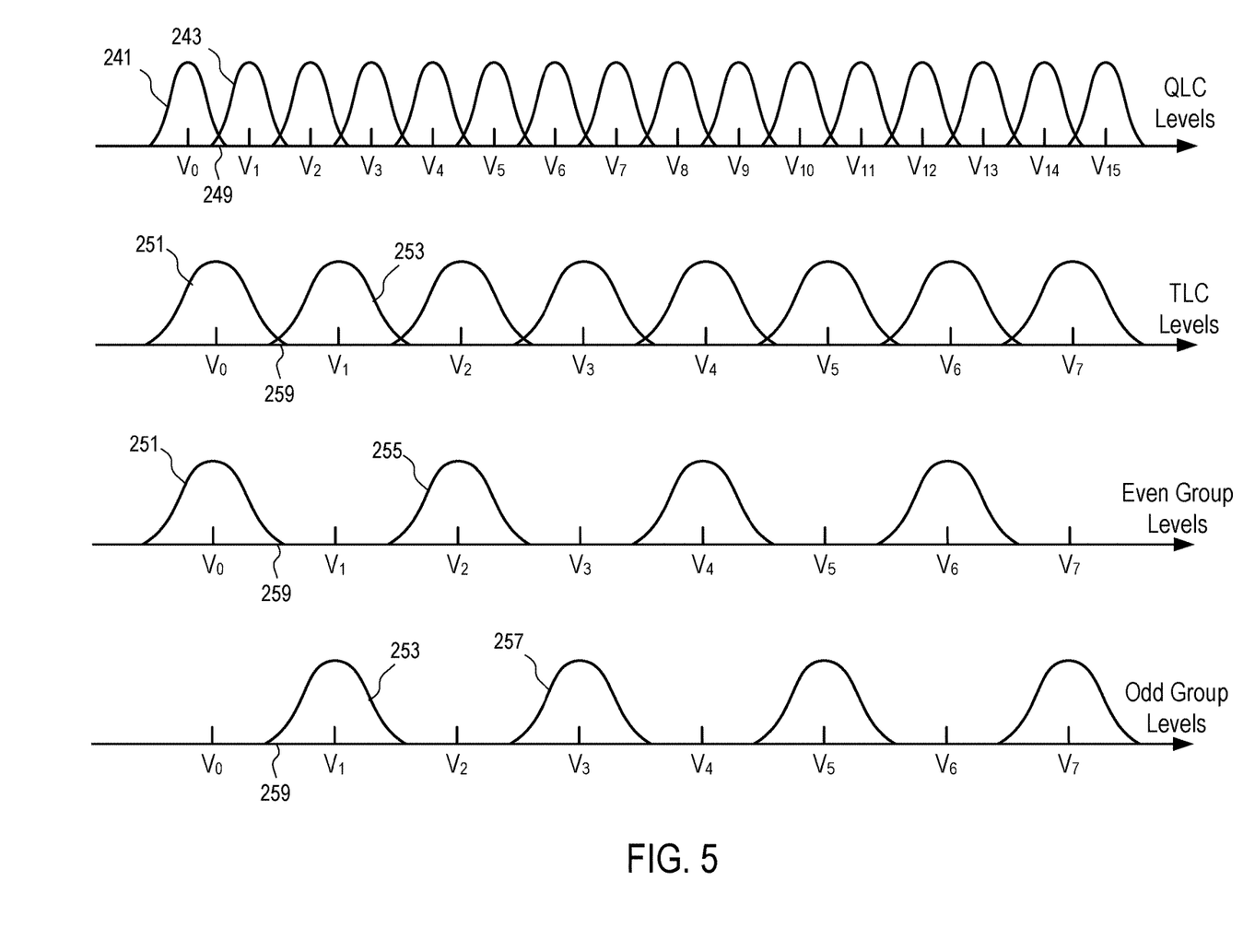
FIG. 5 illustrates voltage distributions for two-pass programming of memory cells according to one embodiment.

For the fine programming of the memory cell 137 to store the data bits 161, 163, . . . , 165, the read/write circuit 143 can read 211 the group identification of the memory cell 137 from the memory cell 191 to assist the operation to read 213 the memory 137 for the retrieval of the data bits 163 to 165. The group identification 207 eliminates half of the possible threshold levels representative of the values of the data bits 163 to 165. Thus, the group identification allows the read/write circuit 143 to determine the values of the data bits 163, . . . , 165 from the threshold voltage 221 that is coarsely programmed into a relatively wide region of threshold distribution, as illustrated in FIG. 5. The read/write circuit 143 can read 213 the data bits 163, . . . , 165 from the memory cell 137 into the latches 183, . . . , 185 respectively.

For the fine programming of the memory cell 137, the memory device 130 is to further receive 215 the data bit 161 from the controller 115 of the memory sub-system 110. When the data bits 161, 163, . . . , 165 are in the latches 181, 183, . . . , 185 respectively, the read/write circuit 143 can determine the fine programming threshold levels 223 through a mapping 217 between bit value combinations and fine programming threshold levels.

A second pass operation of threshold programming 229 is performed to move the threshold voltage 225 of the memory cell 137 of a memory cell group 131 to a relatively narrow region of threshold distribution. The region is sufficiently narrow to allow the read/write circuit 143 to determine the data bits 161, 163, . . . , 165 based on sensing the threshold voltage 225 of the memory cell 137.

FIG. 4 illustrates an example of programming N−1 bits in the first pass and programming N bits in the second pass. In general, the first pass can be configured to program N−j bits; and the second pass is used to program additional j bits so that a total of N bits are programmed through the two passes.

FIG. 5 illustrates voltage distributions for two-pass programming of memory cells according to one embodiment. For example, the two-pass programming technique of FIG. 4 can be implemented based on the distributions illustrated in FIG. 5 to store data in a QLC mode (four bits per memory cell).

In FIG. 5, to program a memory cell 137 to store data in the QLC mode, the threshold voltage of the memory cells is moved to one of 16 QLC threshold levels 0, 1, . . . , 15 centered at voltages $V_0, V_2, \ldots, V_{15}$. For example, when the memory cell 137 is programmed to QLC threshold level 0, the probability level of the threshold voltage of the memory cell 137 being at voltages near $V_0$ is illustrated by a curve 241 centered at $V_0$. The voltage range of the curve 241 represents the region of threshold distribution at QLC threshold level 0.

Similarly, when the memory cell 137 is programmed to QLC threshold level 1, the probability level of the threshold voltage of the memory cell 137 being at voltages near $V_1$ is illustrated by a curve 243 centered at $V_1$. The voltage range of the curve 243 represents the region of threshold distribution at QLC threshold level 1.

At the voltage region 249, the curves 241 and 243 overlap with each other, which indicates that when the threshold voltage of the memory cell 137 is found in the region 249, there is an ambiguity as to whether the memory cell 137 is programmed at threshold level 0 to represent one set of bit values, or at threshold level 1 to represent another set of bit values. When the mapping between the bit value combinations and threshold levels is based on a Gray code, the bit values represented by threshold level 0 and threshold level 1 differ by one bit. Thus, there is a small probability that this bit, determined based on the threshold voltage of the memory cell 137, is read incorrectly. An error in such a bit can be typically detected and corrected via ECC/LPDC decoding of a codeword (e.g., 153) in a data group (e.g., 151) that contains the bit. Reducing the overlapping region can improve the accuracy in reading the memory cell 137. However, reducing the widths of the distribution curves 241, 243 requires higher precision and thus longer time in programming the threshold voltage of the memory cell 137.

In FIG. 5, to program the threshold voltage of the memory cell 137 to the QLC levels with narrow distribution curves 241, 243, etc., the read/write circuit 143 of the memory device 130 initially programs coarsely the memory cells to TLC levels 0, 1, . . . , 7 according to three data bits (e.g., 163, . . . , 165) of the four data bits (e.g., 161, 163, . . . , 165) to be stored in the memory cell 137.

For example, when the three data bits of the memory cell 137 is coarsely programmed to TLC threshold level 0, the probability level of the threshold voltage of the memory cell 137 being at voltages near $V_0$ is illustrated by a curve 251 centered at $V_0$ of TLC levels. The voltage range of the curve 251 represents the region of threshold distribution at TLC threshold level 0.

Similarly, when the three data bits of the memory cell 137 is coarsely programmed to TLC threshold level 1, the probability level of the threshold voltage of the memory cell 137 being at voltages near $V_1$ is illustrated by a curve 253 centered at $V_1$ of TLC levels. The voltage range of the curve 253 represents the region of threshold distribution at TLC threshold level 1.

At the voltage region 259, the TLC curves 251 and 253 overlap with each other. Reducing the overlap between the TLC curves 251 and 253 can lead to a longer time for performing coarse programming.

To reduce the time for coarse programming without reducing the accuracy in reading the three data bits programmed using the TLC levels, a group identification 207 is computed and/or stored to indicate whether the memory cell 137 is programmed to an odd numbered TLC threshold level, or an even numbered TLC threshold level.

When the group identification 207 indicates that the memory cell 137 is coarsely programmed to an even numbered TLC threshold level, the possible threshold voltage distributions are represented by the alternating curves 251, 255, etc. The distribution curves at the odd numbered TLC threshold levels (e.g., curve 253 centered at $V_1$) are not possible. Thus, when the threshold voltage of the memory cell 137 is found in the region 259, there is no ambiguity in the values of the three bits programmed via the threshold voltage of the memory cell 137.

Similarly, when the group identification 207 indicates that the memory cell 137 is coarsely programmed to an odd numbered TLC threshold level, the possible threshold voltage distributions are represented by the alternating curves 253, 257, etc. The distribution curves at the even numbered TLC threshold levels (e.g., curve 251 centered at $V_1$) are not possible. Thus, when the threshold voltage of the memory cell 137 is found in the region 259, there is no ambiguity in the values of the three data bits programmed via the threshold voltage of the memory cell 137.

The group identification 207 allows the read/write circuit 143 to differentiate the alternating TLC distribution curves 251, 255, . . . , for a memory cell coarsely programmed according to even group levels, or to differentiate the alternating TLC distribution curves 253, 257, . . . , for a memory cell coarsely programmed according to odd group levels. Since reading the even group levels (or the odd group levels) corresponds to the determination of one out of four possible states, the distribution curves (251, 255, . . . ; 253, 257, . . . ) can be as coarse as programmed for MLC modes; and the coarsely programmed memory cell 137 can be read in a MCL mode identified by the group identification 207.

For example, based on the group identification 207 identifying the memory cell 137 being coarsely programmed according to the even group levels, the read/write circuit 143 can use an MLC read mode to determine the coarsely programmed threshold level of the memory cell 137 and thus the three data bits (e.g., 163, . . . , 165) stored in the memory cell 137 through coarse programming.

Similarly, based on the group identification 207 identifying the memory cell 137 being coarsely programmed according to the odd group levels, the read/write circuit 143 can use an MLC read mode to determine the coarsely programmed threshold level of the memory cell 137 and thus the three data bits (e.g., 163, . . . , 165) stored in the memory cell 137 through coarse programming.

From an alternative point of view, the even group levels can be seen as the result of programming the corresponding data to the even group levels in a first MLC mode; and the even group levels can be seen as the result of programming the corresponding data to the odd group levels in a second MLC mode. The first and second MLC modes are configured such that their regions of threshold distribution are interleaved as in the TLC levels and coincide with the TCL levels. Thus, based on the group identification 207, the memory cell 137 is to be either read according to the first MLC mode, or the second MLC mode.

After the threshold voltage of the memory cell 137 is coarsely programmed to a TLC level, the threshold voltage of the memory cell 137 can be further finely programmed to a nearby QLC level identified by the four data bits (e.g., 161, 163, . . . , 165) to be stored in the memory cell 137.

For example, when the memory cell 137 is initially programmed to TLC level 0 having a distribution curve of 251, the additional data bit (e.g., 161) of the memory cell 137 can further identify that the memory cell 137 is to be programmed to QLC level 0 or 1 represented by the distribution curves 241 or 243 respectively. Since the memory cell 137 has been coarsely programmed to have the probability levels at voltages near $V_0$ of TLC levels represented by the wide distribution curve 251, it takes less time to further fine program it to QLC threshold levels 0 or 1 with a narrow distribution curve 241 or 243 (less than directly programming the threshold voltage of the memory cell 137 from a state of having been erased).

FIG. 6 shows mapping to threshold levels and group identifications in two-pass programming of memory cells to store data according to one embodiment. For example, the mapping of FIG. 6 can be used with the distribution curves illustrated in FIG. 5.

FIG. 6 illustrates an example of data programming in a QLC mode where the threshold voltage of a memory cell (e.g., 137) is programmed to represent the values of four bits. A page of memory cells is programmed (written into) together. Since each cell stores four bits, the page of memory cells can store four data pages of data bits, where the number of data bits in a data page is equal to the number of memory cells in a memory cell page. For example, each data page is an example of a data group illustrated in FIG. 3; and the memory cell page is an example of a memory cell group illustrated in FIG. 3.

Conventionally and/or for convenience, the four data pages for a QLC mode are named as lower page (LP), upper page (UP), extra page (XP), and top page (TP) respectively. A memory cell (e.g., 137) in a QLC mode stores one bit from each of the four pages. Since the values of the four data bits stored in a memory cell (e.g., 137) have 16 different combinations, as illustrated in the table shown in FIG. 6, the threshold voltage of the memory cell (e.g., 137) is programmed to one of 16 QLC threshold levels to represent a corresponding combination of bit values.

The table shown in FIG. 6 illustrates an example Gray code that maps between the values of the four data bits (e.g., 161, 163, . . . , 165) stored in a QLC memory cell (e.g., 137) and the threshold level 203 of the memory cell (e.g., 137). For example, when the memory cell (e.g., 137) is determined to have a QLC threshold level of 0, the memory cell (e.g., 137) is considered to store 1 as the TP bit, 1 as the XP bit, 1 as the UP bit, and 1 as the LP bit. Similarly, to store 0, 1, 1, and 1 as TP, XP, UP and LP bits in the memory cell (e.g., 137), the threshold voltage is programmed to level 1. An increasing threshold level represents an increasing threshold voltage to be programmed for the memory cell (e.g., 137).

A Gray code (e.g., as illustrated in the table of FIG. 6) has the characteristics/propriety where one and only one bit value changes between two successive threshold levels. For example, when QLC threshold level changes from 0 to 1, only the TP bit changes from 1 to 0 in the table of FIG. 6. Similarly, when QLC threshold level changes between 1 and 2 (or, 2 and 3, 3 and 4, 4 and 5, etc.), only the LP bit changes (or, the TP bit, the UP bit, the TP bit, etc. respectively).

In FIG. 6, each pair of adjacent odd and even numbered QLC levels share the same set of XP, UP and LP bits. This allows combinations of XP, UP and LP bits to be mapped to TLC levels 0, 1, . . . , 7. Since QLC levels 0 and 1 share a common TLC level 0, coarsely programming the memory cell 137 to TLC Level 0 causes the threshold voltage of the memory to be close to the QLC Level 0 and Level 1. Similarly, since QLC levels 2 and 3 share a common TLC level 1, coarsely programming the memory cell 137 to TLC Level 1 causes the threshold voltage of the memory to be close to the QLC Level 2 and Level 3.

In FIG. 6, the group identification has a value of 1 to indicate that the memory cell 137 has an even numbered TLC level (e.g., 0, 2, 4, 6); and the group identification has a value of 0 to indicate that the memory cell 137 has an odd numbered TLC level (e.g., 1, 3, 5, 7). The group identification can be calculated from XOR or XNOR of the XP, UP, and LP bits (or from the TLC level number).

Since the group identification is computed from XOR (or XNOR) of UP, UP, and LP bits (or from the TLC level number), one of the XP, UP, and LP bits can be computed from XOR (or XNOR) of the group identification with other bits. For example, XP bit can be computed from XOR (or XNOR) of the group ID, the UP bit and the LP bit.

The XP, UP, and LP bits having group identification 207 equal to one are not independent from each other, since any of the bits can be calculated from XOR (or XNOR) of the group identification 207 (which is one) and the remaining bits. Any two of the XP, UP and LP bits can be seen as being mapped and programmed in MLC mode according to the mapping from their bit values to the even MLC levels shown in the table of FIG. 6, where the voltage regions of the even MLC levels are centered at even group levels $V_0$, $V_2$, $V_4$, and $V_6$ in FIG. 5. Thus, a coarsely programmed memory cell (e.g., 137) having a group identification 207 equal to one can be read in an MLC mode using the mapping to the even MLC levels as in the table of FIG. 6.

Similarly, the XP, UP, and LP bits having group identification 207 equal to zero are not independent from each other, since any of the bits can be calculated from XOR (or XNOR) of the group identification 207 (which is zero) and the remaining bits. Any two of the XP, UP and LP bits can be seen as being mapped and programmed in MLC mode according to the mapping from their bit values to the odd MLC levels shown in the table of FIG. 6, where the voltage regions of the odd MLC levels are centered at odd group levels $V_1$, $V_3$, $V_5$, and $V_7$ in FIG. 5. Thus, a coarsely programmed memory cell (e.g., 137) having a group identification 207 equal to zero can be read in an MLC mode using the mapping to the odd MLC levels as in the table of FIG. 6.

Figure 7:
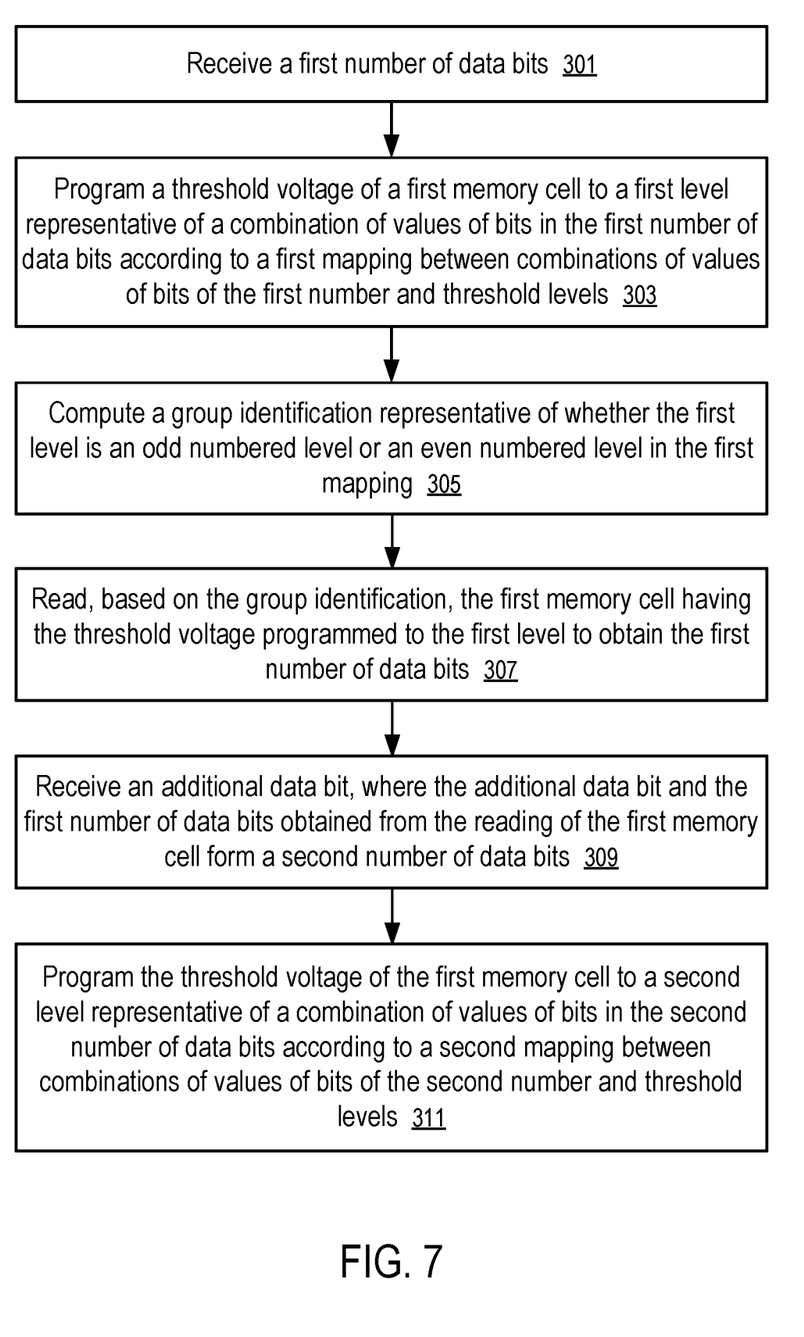
FIG. 7 shows a method of two-pass programming of memory cells according to some embodiments.

FIG. 7 shows a method of two-pass programming of memory cells according to some embodiments. The methods of FIG. 7 can be performed by processing logic that can include hardware (e.g., processing device, circuitry, dedicated logic, programmable logic, microcode, hardware of a device, integrated circuit, etc.), software/firmware (e.g., instructions run or executed on a processing device), or a combination thereof. In some embodiments, the method of FIG. 7 is performed at least in part by the controller 115 of FIG. 1, or processing logic in the memory device 130 of FIG. 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

For example, the methods of FIG. 7 can be performed in a memory sub-system 110 illustrated in FIG. 1 using an integrated circuit memory device 130 of FIG. 2 with data programming techniques of FIGS. 3 to 6.

At block 301, a memory device 130 receives a first number of data bits (e.g., 163, . . . , 165) for a first-pass programming into a memory cell (e.g., 137).

Typically, a group of memory cells (e.g., a page) are programmed together. Thus, the memory device can receive the first number of groups of data bits for the group of memory cells, where each group of data bits has one data bit for each of the memory cells, and each memory cell is to store one data bit from of the data bit groups.

The first-pass programming is performed after the memory cell (e.g., 137) has been previously erased; and the memory cell (e.g., 137) has not yet been programmed to store data since the most recent erasure operation. The first-pass programming is performed to move the threshold voltage of the memory cell (e.g., 137) to a region closer to a level that is to be programmed in a second pass for storing more bits than the first number At block 303, the read/write circuit 143 of the memory device 130 programs a threshold voltage of a first memory cell (e.g., 137) to a first level representative of a combination of values of bits, in the first number of data bits, according to a first mapping between combinations of values of bits of the first number and threshold levels.

For example, the first number is three; and three bits is used in the first mapping to identify the threshold level for the particular combinations of the values of the three bits. In such an example, the first mapping associates eight threshold levels with eight possible combinations of values of three bits. The eight threshold levels are similar to, or the same as, threshold levels for storing three bits per memory cell (e.g., triple level cell (TLC) mode). However, the TLC mode programming of the first pass can be coarse in that regions of threshold distributions of adjacent threshold levels can have significant overlap. The significant overlap can result in large probability levels of reading the memory cell (e.g., 137) based on the coarsely programmed threshold level. However, the coarse programming can reduce the time used to complete the coarse programming. To speed up the reading of the coarsely programmed memory cell and/or avoid reading error, a group identification can be used to indicate the group of possible threshold levels that has been coarsely programmed for the memory cell (e.g., 137). The group identification identifies whether the memory cell (e.g., 137) is programmed to the four odd numbered TLC levels or the four even numbered TLC levels. The four odd numbered TLC levels can be considered as a set of multi-level cell (MLC) threshold levels representing an odd number of subset of the eight possible combinations of bit values; and the four even numbered TLC levels can be considered as another set of multi-level cell (MLC) threshold levels representing an even number of subset of the eight possible combinations of bit values. Thus, the group identification allows the read/write circuit 143 of the memory device 130 to use an MLC technique to read the coarsely programmed memory cell.

In general, such a group identification can be used the reading of a memory cell (e.g., 137) coarsely programmed to store the first number of data bits.

At block 305, the memory device 130 computes a group identification 207 representative of whether the first level is an odd numbered level or an even numbered level in the first mapping.

To reduce the buffer requirements, the memory device 130 can store the group identification 207 in a second memory cell (e.g., 191) by programming a threshold voltage of the second memory cell to represent a data bit representative of the group identification 207. For example, the second memory cell (e.g., 191) can be programmed in a single level cell (SLC) mode to store the group identification 207.

For example, when a TLC page of memory cells is coarsely programmed to store three pages of data (e.g., XP, UP, LP), a page of group identifications can be computed and stored/buffered in a SLC page to assist the reading of the coarsely programmed TLC page.

For example, the group identification 207 can be computed from XOR or XNOR of the first number of data bits (e.g., 163, . . . , 165).

At block 307, the read/write circuit 143 of the memory device 130 reads 211, based on the group identification 207, the first memory cell (e.g., 137) having the threshold voltage coarsely programmed to the first level to obtain the first number of data bits (e.g., 163, . . . , 165) back from the first memory cell (e.g., 137).

For example, the first number of data bits (e.g., 163, ..., 165) can be read into the latches (e.g., 183, ..., 185) as input data for the second pass of fine programming of more data bits.

When the group identification 207 is computed from XOR or XNOR of the first number of data bits (e.g., 163, ..., 165), one of the data bits (e.g., 163, ..., 165) can be computed from XOR or XNOR of the group identification 207 and other data bits.

At block 309, the memory device 130 receives an additional data bit (e.g., 161). The additional data bit (e.g., 161) and the first number of data bits (e.g., 163, ..., 165) obtained from the reading of the first memory cell (e.g., 137) together form a second number of data bits (e.g., 161, 163, ..., 165).

For example, the second number of data bits (e.g., 161, 163, ..., 165) can be received into the latches (e.g., 181, 183, ..., 185) to form the input data for the second pass programming of the first memory cell (e.g., 137).

At block 311, the read/write circuit 143 of the memory device 130 programs the threshold voltage of the first memory cell (e.g., 137) to a second level representative of a combination of values of bits in the second number of data bits according to a second mapping between combinations of values of bits of the second number and threshold levels.

For example, the first mapping is for a TLC coarse programming; and the second mapping is for a QLC fine programming. After the fine programming, overlapping among regions of threshold distributions of QLC threshold levels are reduced; and it is not necessary to use a group indicator to assist the reading of the first memory cell (e.g., 137) programmed in QLC mode.

The second mapping is configured such that two bit value combinations share the same first number of the data bits are mapped to adjacent threshold levels. Thus, the threshold voltage of the first memory cell (e.g., 137) coarsely programmed according to the first level is close to the region of threshold distribution finely programmed to the second level.

Figure 8:
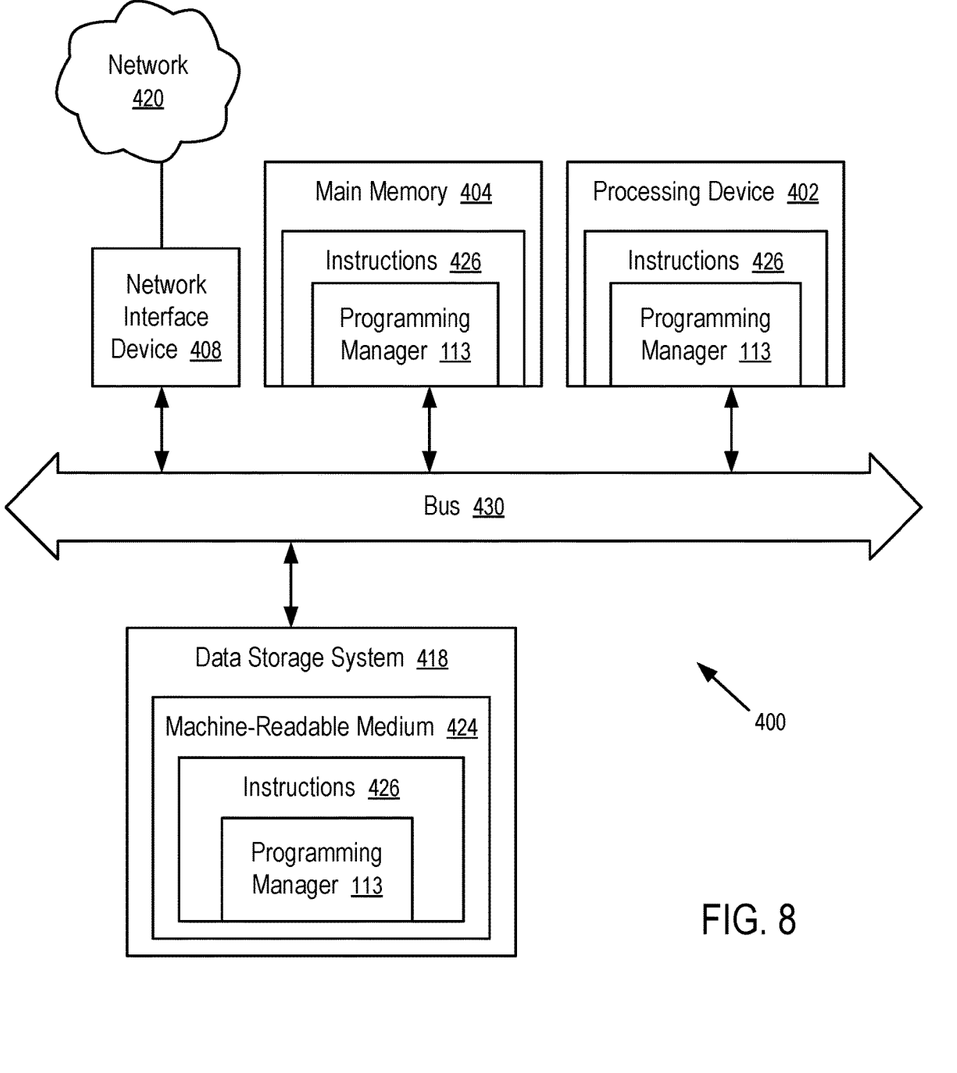
FIG. 8 is a block diagram of an example computer system in which embodiments of the present disclosure can operate.

FIG. 8 illustrates an example machine of a computer system 400 within which a set of instructions, for causing the machine to perform any one or more of the methodologies discussed herein, can be executed. In some embodiments, the computer system 400 can correspond to a host system (e.g., the host system 120 of FIG. 1) that includes, is coupled to, or utilizes a memory sub-system (e.g., the memory sub-system 110 of FIG. 1) or can be used to perform the operations of a programming manager 113 (e.g., to execute instructions to perform operations corresponding to the programming manager 113 described with reference to FIGS. 1-7). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 400 includes a processing device 402, a main memory 404 (e.g., read-only memory (ROM), flash memory, dynamic random access memory (DRAM) such as synchronous DRAM (SDRAM) or Rambus DRAM (RDRAM), static random access memory (SRAM), etc.), and a data storage system 418, which communicate with each other via a bus 430 (which can include multiple buses).

Processing device 402 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 402 can also be one or more special-purpose processing devices such as an application specific integrated circuit (ASIC), a field programmable gate array (FPGA), a digital signal processor (DSP), network processor, or the like. The processing device 402 is configured to execute instructions 426 for performing the operations and steps discussed herein. The computer system 400 can further include a network interface device 408 to communicate over the network 420.

The data storage system 418 can include a machine-readable medium 424 (also known as a computer-readable medium) on which is stored one or more sets of instructions 426 or software embodying any one or more of the methodologies or functions described herein. The instructions 426 can also reside, completely or at least partially, within the main memory 404 and/or within the processing device 402 during execution thereof by the computer system 400, the main memory 404 and the processing device 402 also constituting machine-readable storage media. The machine-readable medium 424, data storage system 418, and/or main memory 404 can correspond to the memory sub-system 110 of FIG. 1.

In one embodiment, the instructions 426 include instructions to implement functionality corresponding to a programming manager 113 (e.g., the programming manager 113 described with reference to FIGS. 1-7). While the machine-readable medium 424 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In this description, various functions and operations are described as being performed by or caused by computer instructions to simplify description. However, those skilled in the art will recognize what is meant by such expressions is that the functions result from execution of the computer instructions by one or more controllers or processors, such as a microprocessor. Alternatively, or in combination, the functions and operations can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method, comprising:
receiving a first number of data bits;
programming a threshold voltage of a first memory cell to a first level representative of a combination of values of bits in the first number of data bits according to a first mapping between combinations of values of bits of the first number and threshold levels;
computing a group identification representative of whether the first level is an odd numbered level or an even numbered level in the first mapping;
reading, based on the group identification, the first memory cell having the threshold voltage programmed to the first level to obtain the first number of data bits;
receiving at least one additional data bit, wherein the at least one additional data bit and the first number of data bits obtained from the reading form a second number of data bits; and
programming the threshold voltage of the first memory cell to a second level representative of a combination of values of bits in the second number of data bits according to a second mapping between combinations of values of bits of the second number and threshold levels.

2. The method of claim 1, further comprising:
storing the group identification in a second memory cell by programming a threshold voltage of the second memory cell to represent a data bit representative of the group identification; and
reading the second memory cell to retrieve the group identification for the reading of the first memory cell having the threshold voltage programmed to the first level.

3. The method of claim 2, wherein the computing of the group identification comprises determining XOR or XNOR of the first number of data bits.

4. The method of claim 3, wherein the first number of data bits have a first data bit and second data bits; and the reading of the first memory cell having the threshold voltage programmed to the first level comprises determining XOR or XNOR of the group identification with the second data bits to obtain the first data bit.

5. The method of claim 3, wherein the first level is configured at a vicinity of the second level regardless of a value of the additional data bit.

6. The method of claim 3, wherein the first number is three; the second number is four; and a first mapping is between combinations of values of three bits and triple level cell (TLC) threshold levels; the second mapping is between combinations of values of four bits and quad-level cell (TLC) threshold levels; and the second memory cell is programmed to store the group identification in single level cell (SLC) mode.

7. The method of claim 6, wherein the reading of the first memory cell comprises reading the first memory cell according to multi-level cell (MLC) threshold levels identified by the group identification.

8. The method of claim 3, wherein the reading of the first memory cell comprises:
identifying, based on the group identification, a third mapping between combinations of values of bits of a third number and threshold levels, the third number being equal to the first number minus one; and
reading the first memory cell according to the third mapping.

9. A memory device, comprising:
an integrated circuit package enclosing the memory device;
a plurality of memory cell groups formed on at least one integrated circuit die; and
latches;
wherein in response to a command identifying a first memory cell group within the plurality of memory cell groups, the memory device is configured to, receive a first number of groups of data bits;
program the first memory cell group to store the first number of groups of data bits, wherein a threshold voltage of each respective memory cell in the first memory cell group is programmed to a first level representative of a combination of values of bits of the first number according to a first mapping between combinations of values of bits of the first number and threshold levels;
compute a group identification for the respective memory cell, the group identification representative of whether the first level is an odd numbered level or an even numbered level in the first mapping;
reading, based on the group identification, the first memory cell group to retrieve the first number of groups of data bits into a first portion of the latches;
receiving an additional group of data bits into a second portion of the latches, wherein the additional group of data bits and the first number of groups of data bits form a second number of groups of data bits in the latches; and
programming the first memory cell group to store the second number of groups of data bits, wherein the threshold voltage of the respective memory cell in the first memory cell group is programmed to a second level representative of a combination of values of bits in the second number of data bits according to a second mapping between combinations of values of bits of the second number and threshold levels.

10. The memory device of claim 9, wherein the memory device is further configured to buffer the group identification for the respective memory cell in a second memory cell group within the plurality of memory cell groups in single level cell (SLC) mode; and wherein the first memory cell group and the second memory cell group are of a same type.

11. The memory device of claim 10, wherein a region of threshold distribution resulting from programming at the second level is substantially with a region of threshold distribution resulting from programming at the first level.

12. The memory device of claim 10, wherein the memory device is further configured to read the first memory cell group, programmed to store the first number of groups of data bits, according to a third mapping between combinations of values of bits of a third number and threshold levels, the third number being equal to the first number minus one, and the third mapping identified by the group identification for the respective memory cell.

13. The memory device of claim 12, wherein the first number is three; the second number is four; and a first mapping is between combinations of values of three bits and triple level cell (TLC) threshold levels; the second mapping is between combinations of values of four bits and quad-level cell (QLC) threshold levels; and the second memory cell is programmed to store the group identification in single level cell (SLC) mode.

14. The memory device of claim 13, wherein the third mapping is between combinations of values of two bits and multi-level cell (MLC) threshold levels.

* * * * *